United States Patent [19]
Eng et al.

[11] Patent Number: 5,640,043
[45] Date of Patent: Jun. 17, 1997

[54] HIGH VOLTAGE SILICON DIODE WITH OPTIMUM PLACEMENT OF SILICON-GERMANIUM LAYERS

[75] Inventors: Jack Eng, Cork City, Ireland; Joseph Chan, Kings Park, N.Y.; Lawrence Laterza, Miller Place, N.Y.; Gregory Zakaluk, Seaford, N.Y.; Jun Wu, Flushing, N.Y.; John Amato, Northport, N.Y.; Dennis Garbis, Huntington Station, N.Y.; Willem Einthoven, Belle Mead, N.J.

[73] Assignee: General Instrument Corporation of Delaware, Hatboro, Pa.

[21] Appl. No.: 580,071

[22] Filed: Dec. 20, 1995

[51] Int. Cl.⁶ .......................... H01L 29/06; H01L 27/082
[52] U.S. Cl. .......................... 257/624; 257/623; 257/590; 257/593
[58] Field of Search .................................. 257/618, 623, 257/624, 590, 593

[56] References Cited

U.S. PATENT DOCUMENTS

| | | | |
|---|---|---|---|
| 3,832,246 | 8/1974 | Lynch | 257/623 |
| 4,255,757 | 3/1981 | Hikin | 257/623 |
| 4,740,477 | 4/1988 | Einthoven et al. | 437/8 |
| 5,010,023 | 4/1991 | Einthoven | 437/8 |
| 5,097,308 | 3/1992 | Salih | 357/34 |
| 5,102,810 | 4/1992 | Salih | 437/31 |
| 5,298,457 | 3/1994 | Einthoven et al. | 437/131 |
| 5,342,805 | 8/1994 | Chan | 117/89 |

*Primary Examiner*—Jerome Jackson
*Assistant Examiner*—Nathan K. Kelley
*Attorney, Agent, or Firm*—Irwin Ostroff; Arthur J. Torsiglieri

[57] ABSTRACT

A high voltage silicon rectifier includes a substrate portion and an epitaxial mesa portion that is a frustrum of a pyramid with a substantially square cross section and side walls that make a forty five degree angle with the substrate portion. The mesa portion includes three germanium doped layers that introduce strain to speed up recombination of charge carriers. The topography of the base region of the rectifier has a high-low junction that includes a central portion that is deeper in the mesa than the germanium-doped layers and an edge portion that is shallower in the mesa than the germanium-doped layers and forms a positive bevel angle with the tapered side walls of the mesa.

15 Claims, 1 Drawing Sheet

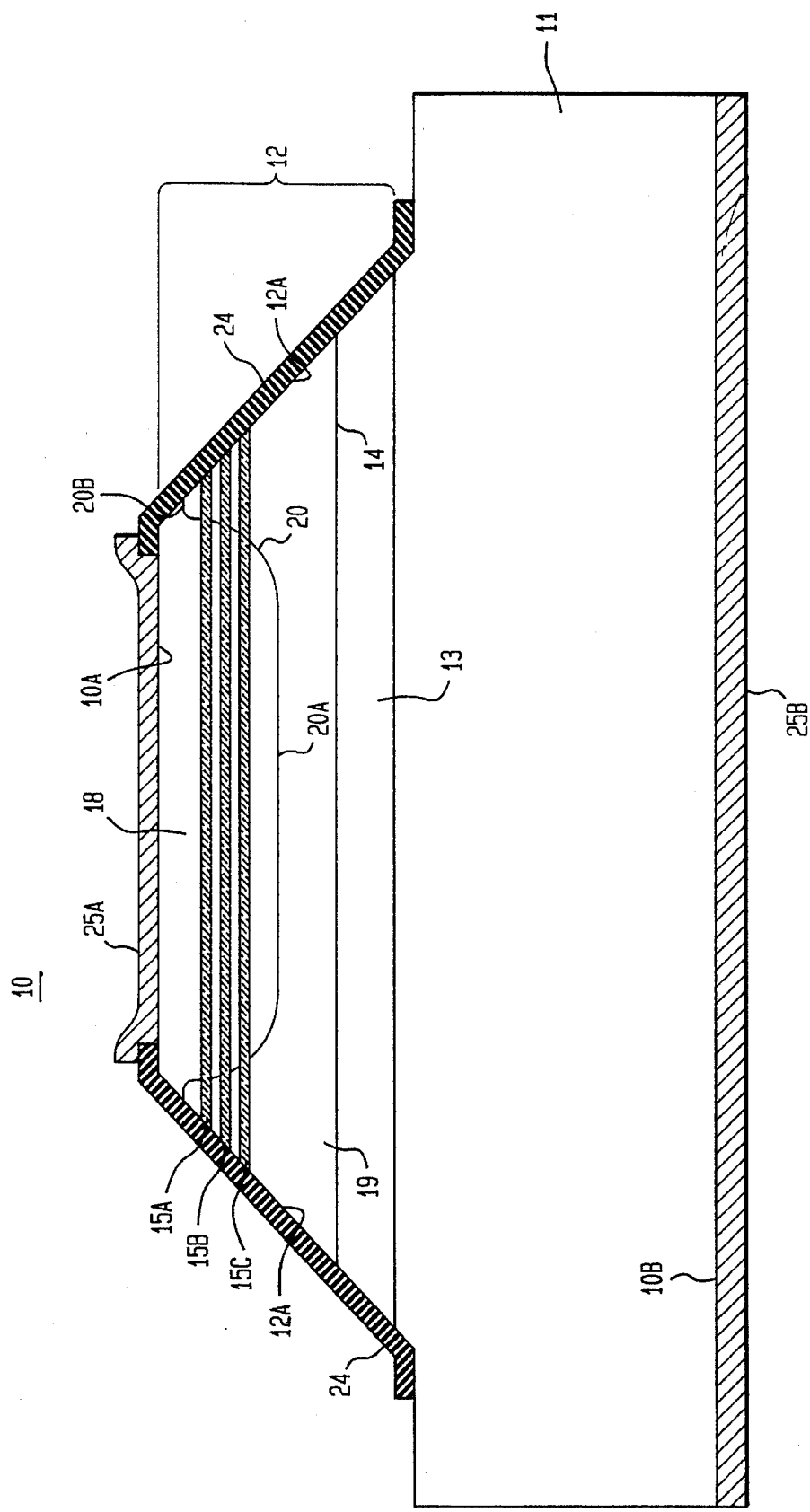

HIGH VOLTAGE SILICON DIODE WITH OPTIMUM PLACEMENT OF SILICON-GERMANIUM LAYERS

FIELD OF THE INVENTION

This invention relates to high voltage silicon rectifiers, and more particularly, to a fast switching device of the kind that has been sometimes described as a fast epitaxial rectifier.

BACKGROUND OF THE INVENTION

The high voltage, fast epitaxial rectifier is a P-N junction diode of monocrystalline silicon in which there have been included one or more thin layers that are germanium-doped. The germanium introduces strain in the crystal that serves to speed up the recombination of charge carriers in the depletion layer of the diode so as to increase the speed with which the diode can be switched from a low-impedance state to a high-impedance state as the voltage across the junction switches from a forward bias to a reverse bias. Diodes of this kind are described in U.S. Pat. No. 5,097,308 (issued on Mar. 17, 1992), U.S. Pat. No. 5,102,810 (issued on Apr. 7, 1992), U.S. Pat. No. 5,298,457 (issued on Mar. 29, 1994), and U.S. Pat. No. 5,342,805 (issued on Aug. 30, 1994).

In high voltage rectifiers it is very important to avoid excessive heating. This is best avoided by providing that the diode exhibits a low voltage drop state when biased in the forward direction and a high voltage state when biased in the reverse direction and that the transition between the two states occurs rapidly. As is known, one of the problems characteristic of such diodes is that when the bias shifts from the forward direction to the reverse direction, charge carriers that have diffused into the high resistivity depletion region of the junction during the forward bias state remain in the high ohmic region. These charge carriers tend to persist for a finite time, usually termed either the recombination time or the minority charge carrier lifetime, and while they persist, the diode remains in a conductive state even though the bias is in the reverse direction. This gives rise to leakage currents that flow in the direction opposite to that desired and these currents can be a major problem. To overcome this problem, it is known to include in the depletion region impurities or crystal imperfections that serve as lifetime killers. As mentioned above, the inclusion of doped germanium layers, typically in the middle of the depletion region, has been used previously to introduce these crystal imperfections that serve this role. Additionally, as described in the aforementioned patents, it is known also to include gold and platinum atoms in the depletion region to augment the role of the doped-germanium layers in this role.

It is also known to be important in high voltage rectifiers that employ silicon diodes to insure that any breakdown of the rectifying junction that may occur, usually because the reverse bias is temporarily excessive because of transients or surges in the power supply, occur in the interior or bulk of the diode rather than at its surface. This is because the interior is more rugged and, accordingly, breakdowns localized in the interior are much less likely to do permanent damage to the diode than are breakdowns at a surface of the diode. To this end, various expedients have been employed, including the use of passivating layers to cover the regions where rectifying junctions intersect the surface or the use of special geometries, such as mesas with tapered side walls, as described in U.S. Pat. No. 5,102,810 (issued on Apr. 7, 1992).

SUMMARY OF THE INVENTION

The present invention is directed to a high voltage silicon rectifier that when forward biased exhibits a low voltage-drop but can be quickly switched to exhibit a high voltage-drop. Additionally, this silicon rectifier is better able to withstand high voltage transients in the reverse bias direction by forcing any resulting breakdown to occur in its interior. Moreover, the silicon rectifier is amenable to relatively easy manufacture.

In particular, a high voltage rectifier in accordance with an illustrative embodiment of the invention is a follows. A silicon chip has a pair of opposed major surfaces, generally plane, and between such surfaces a substrate portion and a mesa portion. Advantageously, the mesa has tapered side walls and is formed from an epitaxial layer that was grown on a silicon substrate to be of silicon with one or more plane layers that are germanium-doped. The chip includes highly doped end regions that are of opposite conductivity types and an intermediate region that is relatively lightly doped of one of the two opposite conductivity types. The P-N junction that is formed between the regions of opposite conductivity type is substantially plane and parallel to the opposed major surfaces. The interface that is formed between the two regions of the different resistivity of the same conductivity type (the high-low junction) advantageously intersects the germanium-doped layers and has a wide central portion deep in the mesa and a narrow edge portion that is shallow in the mesa.

One feature of the rectifier is that the much larger central portion of the high-low junction penetrates slightly beyond the deepest of the germanium-doped layers and close to the P-N junction. We have found this to provide for improved effect of the germanium-doped layers in speeding recombination of the charge carriers.

Another feature is that the shallow edge portion of this high-low junction intersects the side walls of the mesa, which helps insure that any voltage breakdown will occur in the interior of the chip rather than at a surface.

Another feature of the invention is that the relatively high resistivity region that serves as the base of the rectifier has a desirable geometry. It has a relatively narrow width in the interior portion but a relatively wide width along the periphery. This geometry makes it possible to have a low forward-voltage drop while insuring that voltage breakdown is more likely to occur in the interior than at a surface.

In the preferred embodiment, there are three germanium-doped layers; these layers comprise between one-half and ten percent germanium atoms; the mesa portion is the frustrum of a pyramid with a substantially square cross-section with the side walls of the mesa forming approximately 45 degree angles with the base of the pyramid; and gold and platinum atoms are diffused into the mesa portion to segregate largely at the interfaces of the germanium doped layers.

Viewed from one aspect, the present invention is directed to a high voltage rectifier of the kind that comprises an essentially monocrystalline silicon chip having at least one germanium-doped layer. The silicon chip has first and second substantially opposed major surfaces and between these surfaces a substrate portion and a tapered mesa portion. A first region of one conductivity type and of relatively low resistivity is adjacent the first major surface. A second region of the same one conductivity type and of relatively high resistivity is adjacent the first region for forming a high-low junction therebetween. The high-low junction has a deep central plane portion and shallower plane edge portions and intersects the side walls of the mesa. A third region of a conductivity type opposite that of said one conductivity type and of relatively low resistivity is intermediate between the second region and the second major surface. Accordingly, a P-N junction is formed between the second and third regions. Each germanium-doped layer extends transversely in the mesa portion substantially parallel to the major surfaces, and has a peripheral portion in the first region and a central portion in the second region.

Viewed from an other aspect, the present invention is directed to a high voltage rectifier that comprises a silicon chip comprising first and second regions that are part of a mesa having tapered side walls that was formed in an epitaxial portion of the chip. The first region is of relatively low resistivity of one conductivity type and is adjacent a first major surface. The second region is of relatively high resistivity and of the one conductivity type and is contiguous with said first region to form a high-low junction therewith. A third region that was formed in the substrate portion of the chip is of relatively low resistivity and of the conductivity type opposite that of the first and second regions and is adjacent to the second major surface. The high-low junction between the first and second regions has a wide central portion that extends relatively deeply into the mesa and a narrow peripheral portion that extends relatively shallowly into the mesa, the edge of the high-low junction intersecting the tapered side walls of the mesa to form a positive bevel angle. At least one germanium-doped layer extends across the interior of the mesa, has a major central portion in the second region of the chip and has a minor peripheral portion in the first region of the chip.

Viewed from an other aspect, the present invention is directed to a fast high voltage switching rectifier comprising a silicon chip that has first and second opposed major plane surfaces and between such surfaces a substrate portion and an epitaxial mesa portion with tapered side walls. The chip comprises first, second and third regions, and at least one germanium-doped layer in the mesa portion. The first region is in the mesa portion that is adjacent the first surface and of one conductivity type and of relatively low resistivity. The second region is in the mesa portion that is adjacent the first region and of the one conductivity type but of relatively high resistivity. It forms with the first region a high-low junction that has a central portion and an edge portion, the edge portion intersecting the side walls of the mesa relatively close to the first surface and the central portion being spaced relatively distant from the first surface. The third region is adjacent the second surface, and of a conductivity type opposite the one conductivity type for forming a P-N junction with the second region. The at least one germanium-doped layer extends transversely in the mesa portion substantially parallel to the major surfaces and intersects the high-low junction such that its edge portion is on one side of the layers and its central portion is on the opposite side of the layers.

Viewed from still an other aspect, the present invention is directed to a high voltage rectifier comprising a silicon chip having first and second opposed major surfaces and including a substrate portion and a mesa portion that comprise first, second, and third regions of which the first region is adjacent the first major surface and is of the one conductivity type and relatively low resistivity, the second region is intermediate between the first and third regions and is of the one conductivity type and of relatively high resistivity for forming a high-low junction with the first region, and the third region is adjacent the second major surface, is of the opposite conductivity type and forms a P-N junction with the second region, and at least one plane germanium-doped layer that extends substantially parallel to the major surface intersecting the high-low junction in a manner that the high-low junction includes a central portion on one side of the germanium doped layers and an edge portion on the other side of the germanium-doped layers, and the edge portion makes a positive bevel angle with the tapered side walls of the mesa.

The invention will be better understood from the following more detailed description taken with the accompanying drawing.

BRIEF DESCRIPTION OF THE DRAWINGS

The FIGURE shows a cross-sectional view of a semiconductor chip in accordance with a preferred embodiment of the present invention. It is to be noted that the drawing is not necessarily to scale.

DETAILED DESCRIPTION

Referring now to the FIGURE, there is shown a cross-sectional view of a semiconductor chip 10 that typically would have been diced from a larger wafer, as is customary in the art. Generally most of the device processing is done on a wafer scale and the wafer is subsequently diced into individual chips. It will be convenient to discuss the invention with particular respect to a single chip.

The chip 10, which has top and bottom opposed plane surfaces 10A and 10B, respectively, comprises a heavily doped substrate bulk portion 11 that was part of an original heavily doped substrate and a mesa portion 12 that is formed from a layer that was grown epitaxially on the substrate portion 11. To be able to get tapered side walls 12A for the mesa portion 12 by anisotropic etching, the original substrate is cut so that its upper surface on which the epitaxial layer is to be grown, corresponds to a <1-0-0> crystal plane. By way of illustration the original substrate is assumed to have been heavily doped P-type (P++) conductivity.

The epitaxial portion 12 is grown to be of largely very lightly doped N− type conductivity as deposited, typically of about 10 ohm-cm resistivity. However, during the growth of the epitaxial layer, enough acceptor impurities will outdiffuse from the substrate into the first grown material to form a P+ type conductivity region 13 in the epitaxial layer. Accordingly, a P-N junction 14 is formed in the epitaxial layer. Moreover, the growth process is modified to grow three germanium-doped layers 15A, 15B, and 15C in the epitaxial layer 12 so that the epitaxial layer 12 is a composite region that includes both germaniumun-doped and germanium-doped silicon regions. A suitable growth technique is described, for example, in the aforementioned U.S. Pat. No. 5,097,308.

Then the upper portion of the mesa is treated to form an N+ type conductivity region 18 that extends across the top surface 10A of the chip 10. It typically is formed by the indiffusion of donor impurities from the top surface 10A. The remaining intermediate lightly doped N− type region 19 of the mesa 12 can be described as the base of the diode and largely determines its electrical properties. The special topography of the interface of the heavily doped N+ type conductivity diffusion layer 18 with the lightly doped N− type conductivity layer 19 (the high-low junction 20) is a characteristic feature of the invention. The high-low junction 20 includes a central or interior plane portion 20A that is at least ninety per cent of the area of the high-low junction and extends deeply into the mesa portion, beyond the germanium-doped layer 15C (the deepest of the three germanium doped layers). It approaches the P-N junction 14 as closely as possible consistent with the design breakdown voltage (typically about 30 microns for a 600 volt device).

The narrower peripheral or edge portion 20B of the high-low junction 20 advantageously is considerably shallower and lies short of the germanium-doped layer 15A (the shallowest of the three germanium-doped layers). Advantageously, the edge portion 20B includes a substantially plane shoulder that intersects the side wall of the mesa. The wider high ohmic layer formed by this shoulder reduces the electrical field. This shoulder also eases the alignment requirements of the masking used to define the high-low junction 20. Also, together with the fact that the P-N junction 14 makes a positive bevel angle with the mesa side wall, there is insured that any voltage breakdown will occur in the bulk of the diode, as is desirable.

We have found that it is important to locate this high-low junction 20 close to the germanium doped layers 15A, 15B, and 15C to substantially speed up recombination times. In particular, it appears advantageous to extend the central portion 20A of the junction 20 slightly deeper into the interior than the deepest of the germanium doped layers.

It is usually found also useful for speeding up the recombination of charge carriers to incorporate other foreign ions in the base region of the rectifier. Presently the usual choices for the role are gold and platinum ions. These are most effective in providing low reverse currents and a low forward voltage drop when they are located in the transition region between the N+ and N– type conductivity portions of the mesa 12. Since both gold and platinum are fast diffusers in silicon, a sufficient number can be provided in such region by providing a concentration of atoms of these metals on the top surface 10A of the mesa 12 and heating the mesa 12, either selectively or by heating the wafer. The heating should be for a time and at a temperature sufficient for them to diffuse into the interior as deeply as the layers 15a, 15B, and 15C but insufficient for unwanted diffusion of the donor and acceptors used to dope regions 13 and 18. As is known, mobile gold and platinum ions tend to be trapped at the interfaces between the germanium-doped layers and the undoped silicon regions.

Various ways to achieve the preferred topography of the interface 20 are described hereinbelow.

The wafer may be etched to form the mesas 12 either before or after the diffusion that form the N+ type conductivity region 18. Advantageously, the mesa 12 is formed in the manner described in U.S. Pat. No. 5,399,901 (issued on Mar. 21, 1995) to be a frustrum of a pyramid that has a substantially square cross section with rounded corners. As is described in this patent, the preferred mesa geometry described above is realized by providing a square etchant mask having rounded corners on a <100> crystal plane at the top surface of the silicon wafer with the straight sides of the mask disposed at an angle of 45 degrees with the <111> directions on the wafer surface and then treating the masked silicon wafer with a suitable wet etchant, such as hot ethylenediamine, that provides anistropic etching, leaving tapered side walls making about a 45 degree angle with the base of the pyramid.

As mentioned above, the diffusion to form the N+ type conductivity region 18 can be done either before or after the epitaxial layer has been etched to form the mesa 12. If the mesa 12 is already in place, the top surface of the mesa can be implanted with donor ions and ions then diffused by a drive-in diffusion as described in U.S. Pat. No. 5,010,023 (issued on Apr. 23, 1991) to provide a diffused layer with a somewhat concave geometry, penetrating deeper in the central portion than in the peripheral portion. Moreover, by control of the pattern of the implanted ions, a desired topography can usually be obtained. If the diffusion layer is to be formed before the mesas are formed, the desired high-low junction is best achieved by a first diffusion process with a mask with a small opening to form the desired deeper plane central portion 20A followed by a second shallower unmasked diffusion to form the shallower edge portion 20B. Various other techniques for obtaining the desired topography should be apparent to a worker in the art.

The important dimensions of a typical design are as follows. Each of the germanium-doped layers 15A, 15B, and 15C has a thickness of about 2 microns and is spaced apart from its neighbors by about 2 microns. The P+ type conductivity layer 13 has a thickness of about 15 microns. The separation of the P-N junction 14 from the first germanium-doped layer 15C is about 31 microns. A square side of a mesa 12 at its base might range from 40 mils to more than a hundred mils, the larger the size the greater the current rating of the rectifier. The thickness of the heavily doped substrate 11 and that of the N+ type conductivity layer 18 desirably should be no thicker than is necessary to provide adequate mechanical strength and ease of handling. Excess thickness of either merely adds undesirably to the forward voltage drop across the diode. The depth of the donor diffusion should make the diffusion extend just below the deepest of the germanium doped layers 15C.

The design of the diode advantageously is such that the breakdown is essentially base-width limited, i.e., determined by the width or thickness of the N– type conductivity regions 19, rather than limited by the resistivity of the N– type conductivity region 19. The base width advantageously is essentially constant in much of the interior of the rectifier and widens the closer it gets to the sloped side wall 12A of the diode. The widest base width advantageously is made to occur near the top surface of the silicon rather than in the interior to minimize the likelihood of surface breakdown. If desired, the base width can be made to reach the top surface of the silicon, though generally this is not preferred. It should not occur in the depicted embodiment because the high-low junction 20 terminates at the side walls of the mesa rather than at the top surface. The concentration of doping of the N– type conductivity region is chosen such that the depletion region at breakdown will occupy essentially all of the lightly doped high resistivity region 19.

As discussed, it is usually preferable that the depletion layer not reach completely to the top surface 10A and for this reason, the flat peripheral shoulder region 18A of the diffused layer 18 is generally more lightly doped than the central portion.

As is known to workers in the art, the amount of germanium in the germanium-doped layers is generally in the range of one-half to ten percent with two percent usually being preferred.

It will also usually be advantageous to passivate the tapered sidewalls of the mesa, typically by a dielectric coating, as indicated by the layer 24.

Additionally, for interconnection purposes, electrodes 25A and 25B are generally provided to the top and bottom surfaces 10A and 10B, respectively, of the chip 10 in conventional fashion.

It is to be understood that the specific embodiment that has been described is merely illustrative of the general principles of the invention and that various other embodiments will be apparent to the worker in the art. In particular, there may be used the complementary P+, P–, N+ structure and metals other than gold and platinum should be available as alternatives as lifetime killers, or such lifetime killers might be omitted.

What is claimed is:

1. A fast high voltage switching rectifier comprising a silicon chip that has first and second opposed major plane surfaces and between such surfaces a substrate portion and an epitaxial mesa portion with tapered side walls, the chip further characterized in that it comprises:

a first region in the mesa portion that is adjacent the first surface and of one conductivity type and of relatively low resistivity;

a second region in the mesa portion that is adjacent the first region and of the one conductivity type but of relatively high resistivity and that forms with the first region a high-low junction that has a central portion and an edge portion, the edge portion intersecting the side walls of the mesa relatively close to the first surface and the central portion being spaced relatively distant from the first surface;

a third region adjacent the second surface, and of a conductivity type opposite the one conductivity type for forming a P-N junction with the second region; and at least one layer in the mesa portion that is germanium-doped and extends transversely in the mesa portion substantially parallel to the major surfaces and intersects the high-low junction such that its edge portion is on one side of each germanium-doped layer and its central portion is on the opposite side of each germanium-doped layer.

2. The fast high voltage switching rectifier of claim 1 in which there are three plane germanium-doped layers spaced apart with each intersecting the high-low junction in a transition region between the central portion and the edge portion of the high-low junction.

3. The fast high voltage switching rectifier of claim 1 in which the mesa portion of the chip is a frustrum of a pyramid with a square cross section.

4. The fast high voltage switching rectifier of claim 3 in which the mesa portion has side walls that make approximately a forty five degree angle with the substrate portion of the chip.

5. The fast high voltage switching rectifier of claim 1 in which each doped layer includes a concentration of one-half to ten percent germanium atoms.

6. The fast high voltage switching rectifier of claim 5 further comprising lifetime-killing impurities in the first and second regions concentrated at the interfaces between the germanium-doped layers and the adjacent silicon.

7. The fast high voltage switching rectifier of claim 3 in which the germanium-doped layers are approximately two microns thick and spaced apart by approximately two microns.

8. The fast high voltage switching rectifier of claim 1 comprising first and second electrodes on said first and second surfaces, respectively, for making electrical contact to the rectifier.

9. A high voltage rectifier comprising a silicon chip having first and second opposed major surfaces and including a substrate portion and a mesa portion that comprise first, second, and third regions of which the first region is adjacent the first major surface and is of one conductivity type and relatively low resistivity, the second region is intermediate between the first and third regions and is of said one conductivity type and of relatively high resistivity for forming a high-low junction with the first region, and the third region is adjacent the second major surface and of the opposite conductivity type and forms a P-N junction with the second region, and at least one plane germanium-doped layer that extends substantially parallel to the major surface intersecting the high-low junction in a manner that the high-low junction includes a central portion on one side of each germanium-doped layer and an edge portion on the other side of each germanium-doped layer that intersects the tapered side walls of the mesa.

10. The high voltage rectifier of claim 9 further characterized in that there are three germanium-doped layers each of which intersects the high-low junction.

11. The high voltage rectifier of claim 10 further characterized in that the mesa portion is a frustrum of a pyramid with a square cross section and side walls that make approximately a forty-five degree angle with the base.

12. The high voltage rectifier of claim 9 in which the central portion of the high-low junction is essentially a plane and extends close to the P-N junction between the second and third regions and the edge portion of the high-low junction is essentially a plane that extends further from the P-N junction.

13. The high voltage rectifier of claim 12 in which the central portion forms at least ninety percent of the area of the high-low junction and lies close to the P-N junction.

14. The high voltage rectifier of claim 13 in which the second region serves as the base of the rectifier and its resistivity is such that the breakdown of the rectifier is base-width limited.

15. The high voltage device of claim 14 further comprising separate electrodes on the first and second major surfaces for forming a rectifier.

* * * * *